US006903411B1

(12) United States Patent
Chyan et al.

(10) Patent No.: US 6,903,411 B1
(45) Date of Patent: Jun. 7, 2005

(54) ARCHITECTURE FOR CIRCUIT CONNECTION OF A VERTICAL TRANSISTOR

(75) Inventors: Yih-Feng Chyan, Jersey City, NJ (US); John Michael Hergenrother, Short Hills, NJ (US); Donald Paul Monroe, Berkeley Heights, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/648,164

(22) Filed: Aug. 25, 2000

(51) Int. Cl.[7] ............................................. H01L 29/778
(52) U.S. Cl. ..................... 257/329; 257/327; 257/328; 257/508; 257/509
(58) Field of Search .............................. 257/327–331, 257/334, 369, 379–380, 395, 401, 900, 903, 351, 904, 508–509; 365/154, 180, 184; 438/138, 152–156, 206, 268

(56) References Cited

U.S. PATENT DOCUMENTS

| | | | | |
|---|---|---|---|---|
| 4,920,397 A | * | 4/1990 | Ishijima ...................... | 257/334 |
| 5,330,927 A | | 7/1994 | Lee .............................. | 437/52 |
| 5,398,200 A | * | 3/1995 | Mazure et al. .............. | 365/174 |
| 5,408,130 A | * | 4/1995 | Woo et al. ................... | 257/758 |
| 5,414,289 A | * | 5/1995 | Fitch et al. .................. | 257/329 |
| 5,744,846 A | * | 4/1998 | Batra et al. .................. | 257/380 |
| 5,894,149 A | * | 4/1999 | Uenishi et al. ............. | 257/331 |
| 6,297,531 B2 | * | 10/2001 | Armacost et al. .......... | 257/329 |
| 6,300,199 B1 | * | 10/2001 | Reinberg .................... | 438/268 |
| 6,498,367 B1 | * | 12/2002 | Chang et al. ............... | 257/341 |
| 6,630,710 B1 | * | 10/2003 | Augusto ..................... | 257/327 |
| 6,642,575 B1 | * | 11/2003 | Ono et al. ................... | 257/328 |

FOREIGN PATENT DOCUMENTS

GB     2366449     6/2002     .......... H01L/29/78

WO     WO 9842026 A1   *   9/1998

OTHER PUBLICATIONS

Hergenrother, J.M., et al., "The Vertical Replacement–Gate (VRG) MOSFET: A 50–nm Vertical MOSFET With Lithography–Independent Gate Length", I.E.E.E., 4 pages (Mar., 1999).*

* cited by examiner

Primary Examiner—Minhloan Tran
Assistant Examiner—Thomas L. Dickey
(74) Attorney, Agent, or Firm—F. M. Romano

(57) ABSTRACT

An architecture for connection between regions in or adjacent a semiconductor layer. According to one embodiment a semiconductor device includes a first layer of semiconductor material and a first field effect transistor having a first source/drain region formed in the first layer. A channel region of the transistor is formed over the first layer and an associated second source/drain region is formed over the channel region. The device includes a second field effect transistor also having a first source/drain region formed in the first layer. A channel region of the second transistor is formed over the first layer and an associated second source/drain region is formed over the channel region. A conductive layer comprising a metal is positioned between the first source/drain region of each transistor to conduct current from one first source/drain region to the other first source/drain region.

In another embodiment a first device region, is formed on a semiconductor layer. A second device region, is also formed on the semiconductor layer. A conductor layer comprising metal is positioned adjacent the first and second device regions to effect electrical connection between the first and second device regions. A first field effect transistor gate region is formed over the first device region and the conductor layer and a second field effect transistor gate region is formed over the second device region and the conductor layer.

19 Claims, 4 Drawing Sheets

ARCHITECTURE FOR CIRCUIT CONNECTION OF A VERTICAL TRANSISTOR

FIELD OF THE INVENTION

The present invention is directed to a process for fabricating very high density circuitry and, more specifically, the invention relates to a circuit structure incorporating vertical replacement gate (VRG) field effect transistors.

BACKGROUND OF THE INVENTION

Continued efforts to increase the level of integration for integrated circuits have resulted in smaller feature sizes, more compact devices, and lower power operation. With feature sizes and device profiles becoming smaller, the speed of semiconductor circuitry is becoming less dependent on the switching characteristics of individual devices, e.g., metal oxide semiconductor (MOS) transistors, and more dependant on the resistance and capacitance associated with interconnect. Specifically, it is desirable to provide connections with lower resistance in order to increase current density.

In the past, contacts have been made at the device level by formation of heavily doped regions in the semiconductor material and formation of area-intensive contact windows for connection to metal wire. The size of such windows and the presence of the metal connections consumes area to the exclusion of other wiring on the device level and metal level.

Recent advances in design of the MOS field effect transistor (FET) include the vertical replacement gate transistor. See Hergenrother, et al., "The Vertical Replacement-Gate (VRG) MOSFET: A 50-nm Vertical MOSFET with Lithography-Independent Gate Length" *Technical Digest of the International Electron Devices Meeting*, p. 75, 1999. The VRG transistor structure overcomes limitations associated with lithography to achieve a smaller overall transistor geometry. The improvement enables formation of higher density circuit layouts, e.g., SRAM circuits. Nonetheless, it remains desirable to further decrease the area of circuit layouts and reduce limitations on performance such as line resistance.

SUMMARY OF THE INVENTION

To provide further advances in the level of integration for semiconductor devices, an architecture is provided for connection between regions in or adjacent a semiconductor layer. Generally, an integrated circuit structure, having a semiconductor layer with a major surface formed along a plane, includes first and second spaced-apart doped regions formed in the surface. A third doped region of different conductivity type than the first region is positioned over the first region. A metal-containing conductive layer is formed between the first and second regions and above the surface plane, providing electrical connection between the doped regions.

According to one embodiment of the invention a semiconductor device includes a first layer of semiconductor material and a first field effect transistor having a first source/drain region formed in the first layer. The channel region of the transistor is formed over the first layer and an associated second source/drain region is formed over the channel region. The device includes a second field effect transistor also having a first source/drain region formed in the first layer. A channel region of the second transistor is formed over the first layer and an associated second source/drain region is formed over the channel region. A conductive layer comprising a metal is positioned between the first source/drain region of each transistor to conduct current from one first source/drain region to the other first source/drain region.

In an associated method of manufacture an integrated circuit structure is fabricated by providing a semiconductor layer suitable for device formation and having a surface formed along a first plane. Spaced-apart and first and second trenches are formed over the semiconductor layer and a conductor layer is formed over the semiconductor surface, extending between the first trench and the second trench. A plurality of dielectric layers are formed over the metal conductor layer and a vertical transistor with first, second and third doped regions is formed in the first trench. At least a part of the first doped region is formed in the semiconductor layer in electrical contact with the metal conductor layer.

In another associated method for fabricating a semiconductor device a first device region, selected from the group consisting of a source region and a drain region of a field effect transistor, is formed on a semiconductor layer and a second device region, selected from the group consisting of a source region and a drain region of a field effect transistor is also formed on the semiconductor layer. A conductor layer is positioned adjacent the first and second device regions to effect electrical connection between the first and second device regions. A first field effect transistor gate region is formed over the first device regions and the conductor layer and a second field effect transistor gate region is formed over the second device region and the conductor layer.

BRIEF DESCRIPTION OF THE DRAWINGS

The invention is best understood from the following detailed description when read in conjunction with the accompanying figure wherein.

In accordance with common practice the various described features are not drawn to scale, but are drawn to emphasize specific features relevant to the invention. Like numbers denote like elements throughout the figures and text.

DETAILED DESCRIPTION

The described embodiments are based on complementary MOS (CMOS) technology. CMOS integrated circuits having PMOS transistors integrated with NMOS transistor are well known, and a process for fabricating CMOS vertical MOSFETs is described in U.S. Ser. No. 09/335,646 filed Jun. 18, 1999, now abandoned entitled, "A CMOS Integrated Circuit Having Vertical Transistors and a Process for Fabricating Same," filed on Jun. 18, 1999, now incorporated by reference. A more general description on the fabrication of vertical transistor MOSFFTs (of either the NMOS or PMOS type) is taught in commonly assigned U.S. Pat. No. 6,027,975 also incorporated herein by reference. Still another commonly assigned, related application, U.S. Ser. No. 09/528,753 filed Mar. 20, 2000, now U.S. Pat. No. 6,518,622, filed on Mar. 20, 2000, teaches the use of silicides in vertical MOSFETS.

With regard to the fabrication of transistors in an integrated circuit, the term major surface means the surface of a semiconductor layer about which a plurality of transistors are fabricated, e.g., in a planar process. As used herein the term "vertical" means more-or-less orthogonal with respect to the major surface, e.g., typically along the <100> plane of a monocrystalline silicon layer on which transistor devices are fabricated.

The term vertical transistor means a transistor with individual semiconductor components vertically oriented with respect to the major surface so that the current flowing from source to drain flows vertically. By way of example, for a vertical FET the source, channel and drain regions are formed in a relatively vertical alignment with respect to the major surface.

Figure 6:
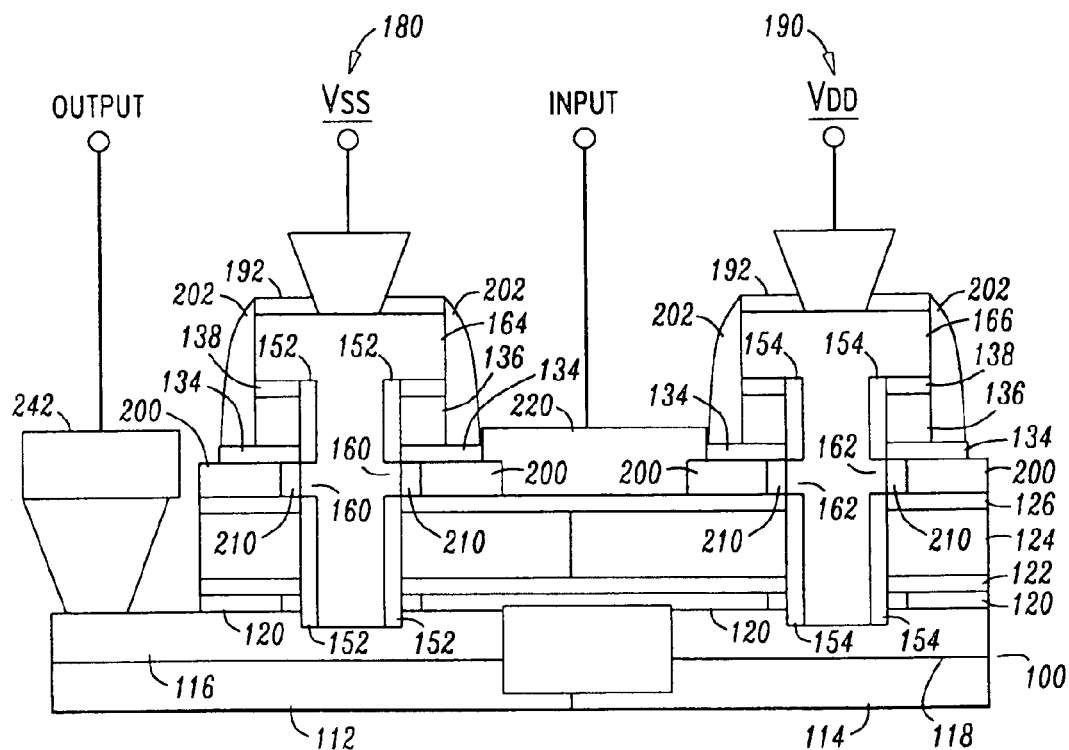

FIGS. 1–6 illustrate in cross section a partial view of an integrated circuit structure 10 during various stages of fabrication in order to configure an exemplary circuit function according to the invention. At times, schematic notation is superimposed on the figures to indicate connections which may be made to other regions of the structure 10 in order to provide a complete circuit. From the description it will be apparent how a plurality of vertical CMOS transistors may be configured alone, or in combination with other devices, e.g., bipolar transistors, capacitors or resistors, to form an integrated circuit. The completed circuit structure of FIG. 6 illustrates a conductive layer formed between a pair of spaced-apart doped regions (source/drain regions) along a plane on a major surface of a semiconductor layer. The conductive layer, positioned above the plane, provides electrical connection between the doped regions.

Figure 1:
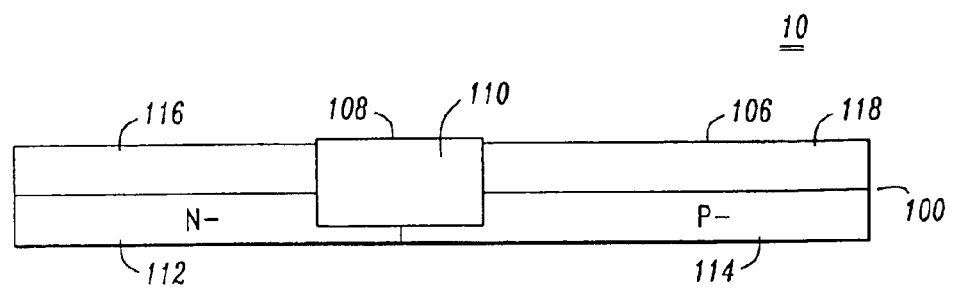
FIGS. 1 through 6 illustrate in cross section a circuit structure according to one embodiment of the invention during sequential stages of fabrication.

With reference to FIG. 1, there is shown a monocrystalline semiconductor layer 100 having an exposed major surface 106 formed along a crystal plane and over an upper portion of the layer 100. An isolation trench 108, formed in the surface 106 by conventional means, is filled with deposited silicon oxide 110. A purpose of the trench is to effect electrical isolation between two regions over which an exemplary pair of transistors are to be formed. In this example, electrically isolated N-type tub regions 112 and P-type tub regions 114 are formed in the surface prior to formation of adjoining CMOS vertical transistor pairs over pairs of regions 112 and 114. The illustrated pair of regions 112 and 114 is conventionally formed with each region on a different side of the trench 108. For example, the N-type tub regions 112 may be formed with a boron implant (300 to 500 keV, $1\times10^{13}/cm^2$) and the P-type tub regions 114 may receive a phosphorous implant (300 to 500 keV, $1\times10^{13}/cm^2$).

Following formation of the regions 112 and 114 a P-type source/drain region 116 is formed in the region 112 and an N-type source/drain region 118 is formed in the region 114. Both source/drain regions are along the surface 106 and may be formed by ion implantation, e.g., a 50 to 100 keV boron implant of $3\times10^{15}/cm^2$ to $10\times10^{15}/cm^2$, over the tub region 112 and a 50 to 100 keV phosphorous implant of $3\times10^{15}/cm^2$ to $10\times10^{15}/cm^2$ over the tub region 114.

Figure 2:
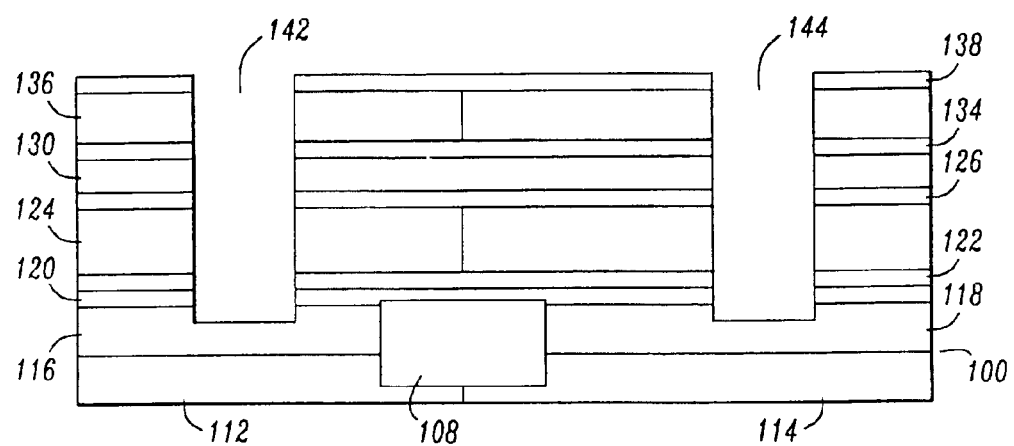
Figure 3:
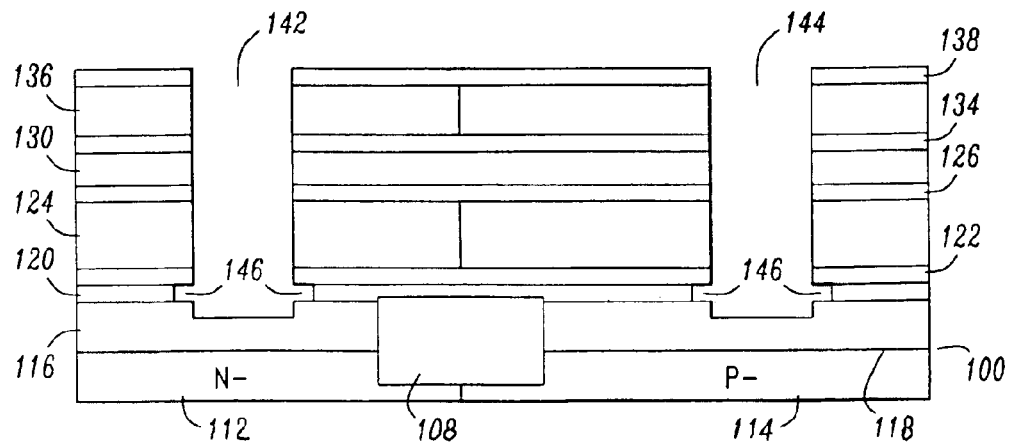
Figure 4:
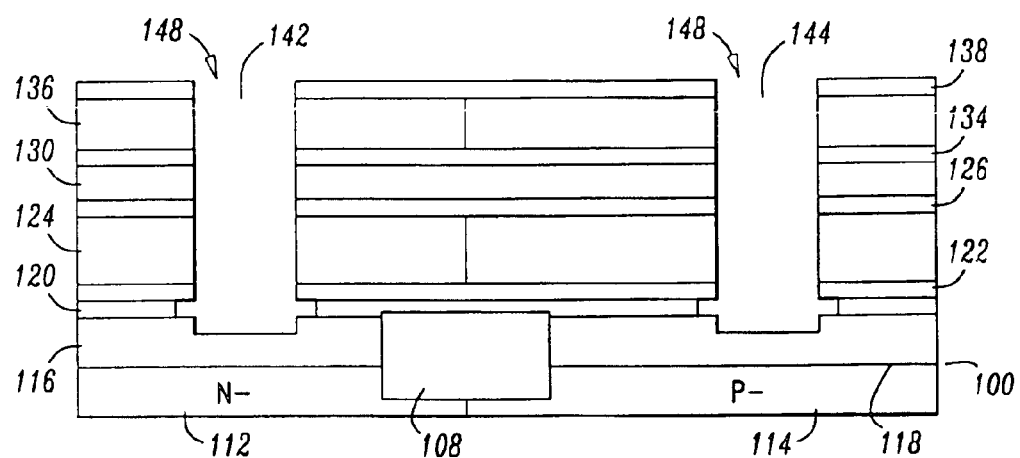
Figure 5:
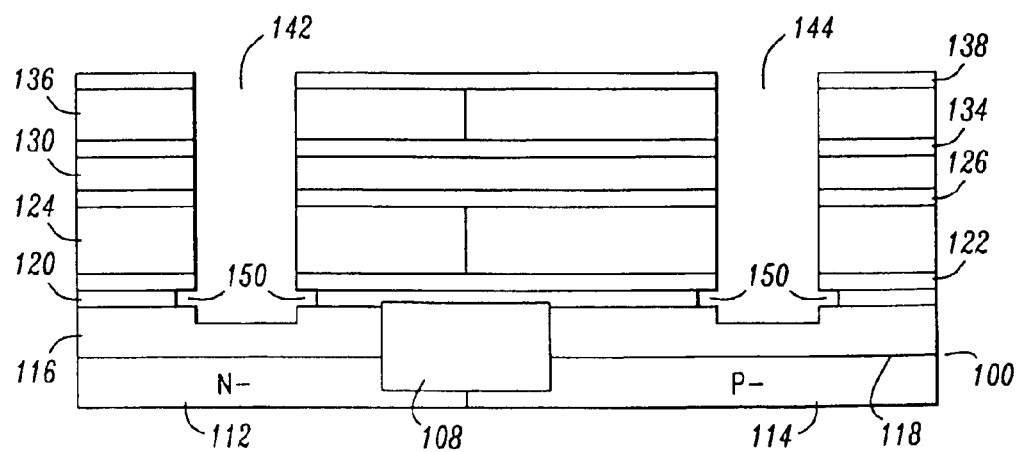

With reference to FIG. 2 multiple layers are formed over the semiconductor layer 100 beginning with a conductive layer 120 positioned adjacent or over the source/drain regions 116 and 118 and extending over the isolation trench 108. To reduce sheet resistance the conductive material should comprise metal and, in a preferred embodiment, is a metal silicide such as tungsten silicide (WSi) formed by CVD. Alternate materials include silicides of cobalt or titanium as well as titanium nitride and tungsten nitride. Other low sheet resistance materials, especially those having a resistance of less then 50 ohm/ square may be used to form the conductive layer 120.

Several layers of dielectric material are formed over the conductive layer 120 beginning with a thin layer 122. The layer 122 is preferably formed of silicon nitride and has a thickness ranging between about 5 nm and about 50 nm in order to function as a diffusion barrier for N-type and P-type dopants. Over the layer 122 there is deposited a relatively thick insulative layer 124 followed by deposition of another thin insulative layer 126.

With further reference to FIG. 2, a layer 130 comprising a silicon oxide is deposited over the silicon nitride layer 126. This layer 130 is later removed according to the replacement gate process taught in the above-referenced '975 patent. However, the thickness of the layer 130 defines the length of subsequently formed FET gates. The silicon oxide may be a conventional deposit from a tetraethyl orthosilicate (TEOS) precursor.

Insulative layers 134, 136 and 138 are next deposited over the silicon oxide layer 130. The layer 134, preferably silicon nitride, is similar in thickness to the layer 126. The two thin layers 126 and 134 on either side of layer 130 provide offset spacer functions. They each have a thickness ranging between about 5 nm and about 50 nm and generally comprise material that resists etching during removal of material of layer 130. Both layers 126 and 134 function as diffusion barriers for N-type and P-type dopants and define the spacing of subsequently formed source/drain extensions relative to the gate of each transistor.

During subsequent processing the insulating layers 124 and 136 will serve to dope the yet-to-be formed source/drain extensions of each transistor through solid source diffusion, creating low-resistance electrical contacts to the active region next to the gate oxide. To this end they contain a high concentration (on the order of $1\times10^{21}/cm^3$) of dopant. For a NMOS FET a suitable dopant is phosphorus, while for a PMOS FET, a suitable dopant is boron. To create both types of transistors, the layers 124 and 136 must therefore be masked to provide the appropriate dopant near the corresponding transistor. One means for achieving this is to deposit a uniform film of one dopant type; then, with conventional lithography, etch to remove portions of the layer; next selectively deposit a layer of the opposite dopant type; and planarize both layers using CMP. The process would be carried out on each of the layers 124 and 136. The thickness of the layers 124 and 136 is used to control the length of the subsequently formed drain extensions.

Layer 136, also a TEOS-deposited oxide, is formed over layer 134 and is comparable to layer 124 in material composition and thickness. Preferably, the layer 138 is also a thin layer of silicon nitride and, generally, should be formed of the same material as layers 122, 126 and 134 with a similar thickness. That is, the layer 138 functions as a CMP stop layer in subsequent processing and has a thickness consistent with this function, e.g., at least about 25 nm. The layer 138 also serves as diffusion barrier for both N- and P-type dopants. All of the layers 122, 124, 126, 130, 134, 136 and 138 may be deposited using conventional chemical vapor deposition (CVD) processes or other well known deposition techniques. With regard to the aforedescribed sequence of layers it should be noted that other embodiments may include significant variations, e.g., fewer layers, while resulting in a vertical channel region for each of the transistors.

FIG. 2 also illustrates a first trench 142 over N-type tub region 112 and a second trench 144 formed over P-type tub region 114. The trenches are formed by conventional patterning with photoresist followed by an anisotropic etch removing portions of the multiple insulative layers and stopping in the source/drain regions 116 and 118. The etch chemistry and other details resulting in formation of the trenches 142 and 144 are well known and are not further described herein.

Next, a selective isotropic etch is performed within each of the trenches 142 and 144 to create recesses 146 in each trench by removal of portions of the conductive layer 120 exposed by the anisotropic trench etch. See FIG. 3. Depending on the composition of the conductive layer 120 the etch chemistry will vary. For example, a suitable chemistry for a selective silicide wet etch is a mixture of sulfuric acid and hydrogen peroxide.

Following formation of the recesses 146 a thin conformal silicon oxide layer 148 is deposited along the walls of the trenches 142 and 144 as well as over the exposed surface of the layer 138. The oxide layer 148 deposits within the recesses 146 as well as along other wall portions of the trenches. See FIG. 4.

With an anisotropic etch silicon oxide material 148 is removed from the wall portions of the trenches 142 and 144 while allowing regions 150 of silicon oxide dielectric to remain in the recesses 146. See FIG. 5. Although dielectric regions 150 comprise silicon oxide, other insulator materials (doped or undoped) may be applied.

With portions of the source/drain regions 116 and 118 exposed by the trench etch process, monocrystalline silicon is epitaxially grown from these regions at the bottoms of the trenches 142 and 144 to form a device quality crystalline silicon layer suitable for creating source/drain extension regions 152 above and below a channel region 160 in the trench 142, and source/drain extension regions 154 above and below a channel region 162 in the trench 144. See FIG. 6. The channel region 160, formed over source/drain region 116, may be undoped or lightly doped with N-type material. The channel region 162, formed over source/drain region 118 may be undoped or lightly doped P-type material. The semiconductor material used to form the channel regions 160 and 162 may be monocrystalline silicon-germanium, or silicon-germanium-carbon, or other semiconductor material. Further, the crystalline material formed in the trench may be deposited as an amorphous or polycrystalline layer and subsequently recrystalized, e.g., by a conventional furnace anneal. Portions of the semiconductor material deposited over the trenches 142 and 144 are removed, e.g., by CMP, which planarizes the deposited monocrystalline layer with the silicon nitride layer 138. Pad regions 164 and 166 are then formed by standard deposition, implant, lithography and etch techniques. The regions 164 and 166 are suitably doped to provide source/drain regions with respect to each respective associated channel region 160 or 162.

With conventional processing PMOS transistor 180 and NMOS transistor 190 are completed over the regions 112 and 114. The pad regions 164 and 166 are completely encased in a dielectric material such as silicon nitride. See layers 192 and 202. After these layers are formed the silicon oxide layer 130 is removed (e.g., with a selective HF etch) and thin gate oxide dielectric regions 210 are thermally grown. Deposition of polysilicon gate regions 200 follows.

For each transistor, the gate conductor region 200 is formed adjacent a gate oxide region 210 to control conduction through a channel region 160 or 162. The gate conductor regions 200 are formed over, but separated from, the conductive layer 120 by the insulative layers 122, 124 and 126. Portions of the silicon nitride layer 134 and the silicon oxide layer 136 are positioned over the conductor regions 200. An insulating layer 192 covers portions of each source/drain region 164 and 166 and dielectric spacers 202 adjacent opposing sides of each plug 164, 166 are conventional, all preferably formed of silicon nitride. A gate input contact 220 is connected to both gate conductor regions to alternately bring each of the transistors 180 and 190 into conduction.

The conductive layer 120 is preferably a continuous film electrically connecting the source/drain region 116 of transistor 180 with the source/drain region of transistor 190. The insulator regions 150 isolate the conductive layer 120 from direct contact with each of the source/drain extensions 152 and 154 adjacent a corresponding source/drain region 116 or 118. If the insulator regions were not present, the interface between the conductor layer 120 and the crystalline silicon would develop dislocations affecting electrical performance. In addition to eliminating area intensive contact windows to effect connection between the source/drain regions, the conductor layer 120 provides a low-sheet resistance path between the regions 116 and 118.

With the source/drain regions 164 and 166 acting as source regions connected to different voltage rails, e.g., Vdd and Vss, and the source/drain regions 116 and 118 acting as drain regions, the transistors form an inverter circuit 240 which operates on a signal provided to the gate input contact 220. The inverter output signal is transmitted from the drain regions 114 and 116 along the conductive layer 120 to an output contact 242. Other details relating to formation of the transistors 180 and 190 are well known. See Monroe et al., "The Vertical Replacement-Gate (VRG) Process for Scalable, General-purpose Complementary Logic," *Proceedings of the International Solid-State Circuits Conference*, p. 134, 2000.

Figure 7:
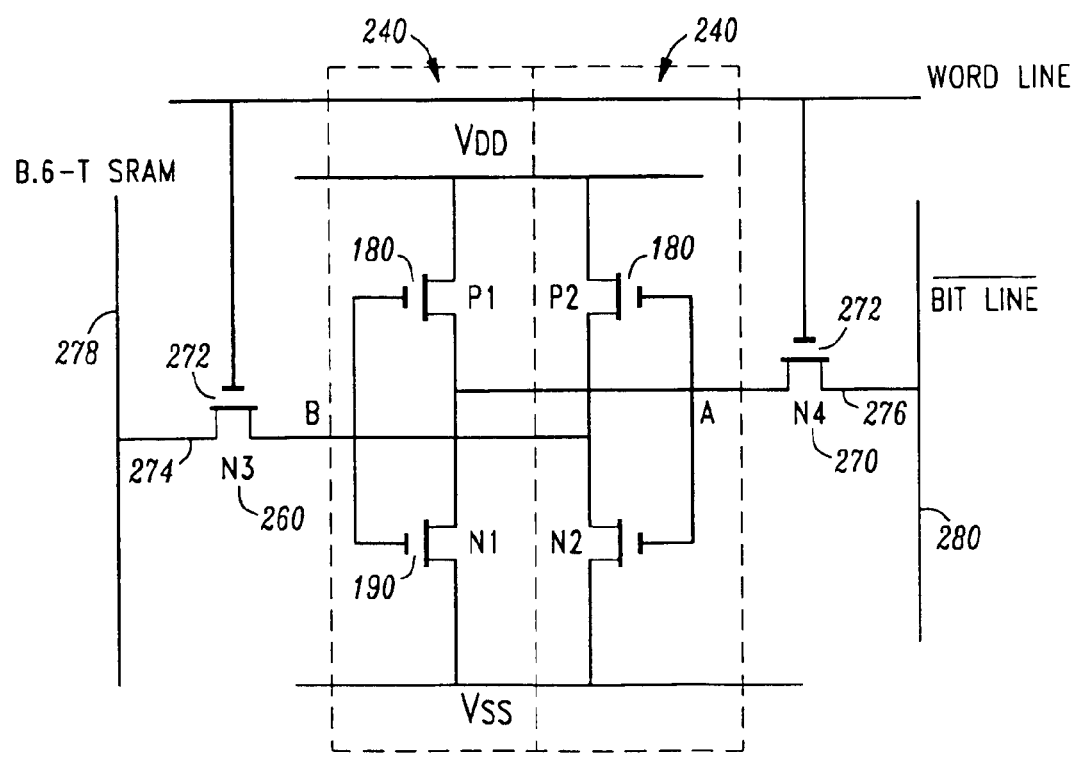
FIG. 7 schematically illustrates a circuit incorporating features of the invention.

A pair of inverter circuits 240 may be combined with two N-type VRG pass transistors 260 and 270 to form an SRAM cell 280. See FIG. 7 which schematically illustrates connection of the gate electrode 272 of each pass transistor 260 and 270 to a Word Line 274. The source 274 of pass transistor 260 is connected to a signal on Bit Line 278 and the source 276 of pass transistor 270 is connected to Inverse Bit Line 280 to receive a signal inverse to that provided on Bit Line 278.

An architecture has been described which is useful for low-resistance interconnection of semiconductor regions in a circuit structure. Preferred embodiments include integrated circuits. While specific applications of the invention have been illustrated, the principles disclosed herein provide a basis for practicing the invention in a variety of ways on a variety of circuit structures including structures formed with III–V compounds and other semiconductor materials. Although the exemplary embodiments pertain to a VRG MOSFET, numerous variations are contemplated. These include structures utilizing a conductor layer such as layer 120 to connect other types of semiconductor devices (such as vertical bipolar transistor devices, diodes and, more generally, diffusion regions) with other devices or regions in a semiconductor layer. Still other constructions, not expressly identified herein, do not depart from the scope of the invention which is only limited by the claims which follow.

What is claimed is:

1. An integrated circuit structure comprising:
   semiconductor layer having a major surface formed along a plane;
   first and second spaced-apart doped regions extending into the surface from the plane;

a monocrystalline third doped region of different conductivity type than the first region, positioned above the plane and over the first region; and a conductive layer between the first and second regions and above the plane, providing electrical connection between the doped regions, wherein the conductive layer comprises one or more materials taken from the group comprising tungsten silicide, tungsten nitride, titanium silicide, titanium nitride and cobalt silicide.

2. The structure of claim 1 wherein the first doped region is a first source/drain region of a MOSFET and the third region is a channel region of the MOSFET.

3. The structure of claim 2 wherein the second region is a portion of a transistor.

4. The structure of claim 2 wherein the second region is a second source/drain region associated with a second MOSFET, said structure further comprising a channel region of the second MOSFET aligned with the second source/drain region.

5. The structure of claim further including:

a fourth doped region over the second region of different conductivity type than the second region;

a fifth doped region over the fourth doped region of the same conductivity type as the second region;

a sixth doped region over the third doped region of the same conductivity type as the first region, said first, second, third, fourth, fifth and sixth regions and conductive layer configured as two interconnected transistors.

6. The structure of claim 5 wherein the two transistors are of complementary conductivity type.

7. The structure of claim 5 wherein one of the transistors is a MOSFET.

8. The structure of claim 5 wherein the transistors are configured to form an inverter circuit.

9. An integrated circuit structure comprising:

a semiconductor layer having a major surface formed along a plane;

first and second spaced-apart doped regions formed in the surface;

a third doped region over the first region of different conductivity type than the first region; and a conductive layer formed between the first and second regions and above the plane, providing electrical connection between the doped regions, wherein the conductive layer comprises one or more materials taken from the group comprising tungsten silicide, tungsten nitride, titanium silicide, titanium nitride and cobalt silicide.

10. The structure of claim 1 wherein the doped regions are configured to form an inverter circuit.

11. The structure of claim 1 wherein the first and second doped regions are first and second source/drain regions and the third region is a channel region, said structure further comprising:

a second channel region formed over the second source/drain region;

third and fourth spaced-apart source/drain regions each vertically aligned with one of the channel regions and one of the first and second source/drain regions; and a conductive element connected to simultaneously control operation of both transistors.

12. The structure of claim 11 wherein the conductive element comprises polysilicon and the transistors each include a gate contact region adjacent the channel region and connected to the conductive element, said transistors configured to form an inverter circuit function.

13. The structure of claim 1 wherein the conductive layer is a continuous film extending from the first region to the second region.

14. The structure of claim 1 wherein the conductive layer physically contact the first region and the second region.

15. A semiconductor device comprising:

a first layer of semiconductor material;

a first field effect transistor having a first source/drain region formed in the first layer, a channel region formed over the first layer and a second source/drain region formed over the channel region;

a second field effect transistor having a first source/drain region formed in the first layer, a channel region formed over the first layer and a second source/drain region formed over the channel region; and a conductive layer in a plane extending between the first layer and the first field effect transistor channel region, said conductive layer comprising a metal positioned between the first source/drain region of each transistor to conduct current from one first source/drain region to the other first source/drain region.

16. The device of claim 15 wherein the first and second transistors are connected to form a circuit.

17. The device of claim 15 comprising a plurality of additional field effect transistors each having a first source/drain region formed in the first layer, a channel region formed over the first layer and a second source/drain region formed over the channel region, the first, second and additional transistors configured into a circuit.

18. The device of claim 17 wherein four of the additional transistors are connected with the first and second transistors to form an SRAM circuit cell.

19. A semiconductor device comprising:

a first layer of semiconductor material;

a first field effect transistor having a first source/drain region formed in the first layer, a channel region formed over the first layer and a second source/drain region formed over the channel region;

a second select transistor having a first source/drain region formed in the first layer, a channel region formed over the first layer and a second source/drain region formed over the channel region; and a conductive layer comprising a metal positioned between the first source/drain region of each transistor to conduct current from one first source/drain region to the other first source/drain region, wherein the conductive layer comprises a metal silicide.

* * * * *